(12) United States Patent
Karam et al.

(10) Patent No.: US 10,164,140 B2
(45) Date of Patent: Dec. 25, 2018

(54) MODULAR SELF-TRACKING MICRO-CONCENTRATOR FOR SPACE POWER

(71) Applicant: The Boeing Company, Chicago, IL (US)

(72) Inventors: Nasser H. Karam, La Canada, CA (US); Scott B. Singer, Sherman Oaks, CA (US); Dimitri Krut, Sylmar, CA (US)

(73) Assignee: The Boeing Company, Chicago, IL (US)

( * ) Notice: Subject to any disclaimer, the term of this patent is extended or adjusted under 35 U.S.C. 154(b) by 106 days.

(21) Appl. No.: 14/534,261

(22) Filed: Nov. 6, 2014

(65) Prior Publication Data

US 2015/0243822 A1 Aug. 27, 2015

Related U.S. Application Data

(63) Continuation-in-part of application No. 14/186,703, filed on Feb. 21, 2014.

(51) Int. Cl.
*H02S 40/36* (2014.01)
*H01L 31/054* (2014.01)
*H02S 50/10* (2014.01)
*H02S 20/32* (2014.01)
*H01L 31/05* (2014.01)

(52) U.S. Cl.
CPC ...... *H01L 31/0547* (2014.12); *H01L 31/0508* (2013.01); *H02S 20/32* (2014.12); *H02S 50/10* (2014.12); *Y02E 10/52* (2013.01); *Y10T 29/49352* (2015.01)

(58) Field of Classification Search
CPC . H01L 31/044; H01L 31/0443; H01L 31/054; H01L 31/0547; H01L 31/02002; H01L 31/02008; H01L 31/02013; Y02E 10/52; H02S 40/22; H02S 20/32; H02S 40/36; H01R 24/68; H01R 24/66; H01R 24/76
USPC .................................................. 136/246, 259
See application file for complete search history.

(56) References Cited

U.S. PATENT DOCUMENTS

2006/0231133 A1* 10/2006 Fork .......................... F24J 2/06
136/246
2010/0012171 A1* 1/2010 Ammar ................. H01L 31/052
136/246

(Continued)

*Primary Examiner* — Susan D Leong
*Assistant Examiner* — Dujuan A Horton
(74) *Attorney, Agent, or Firm* — Miller, Matthias & Hull LLP

(57) ABSTRACT

Technologies for a micro-concentrator modular array. The micro-concentrator modular array may include two or more micro-concentrator solar modules. One or more of the micro-concentrator solar modules may be removable from the micro-concentrator modular array. Micro-concentrator solar modules may be added to a micro-concentrator modular array. One or more of the micro-concentrator solar modules may be electrically and/or mechanically connected to other micro-concentrator solar modules. To facilitate an electrical connection, a conductive connector may be used to connect an electrical output of one micro-concentrator solar module with an electrical input of another micro-concentrator solar module.

31 Claims, 11 Drawing Sheets

(56) References Cited

U.S. PATENT DOCUMENTS

| | | | | |
|---|---|---|---|---|
| 2010/0192941 A1* | 8/2010 | Stoia | ............ | F24J 2/16 |
| | | | | 126/574 |
| 2010/0326498 A1* | 12/2010 | Corneille | .......... | H01L 31/02008 |
| | | | | 136/251 |
| 2013/0000696 A1* | 1/2013 | Giri | ............ | F24J 2/38 |
| | | | | 136/246 |
| 2014/0318602 A1* | 10/2014 | Black | ............... | H01L 31/02013 |
| | | | | 136/251 |

* cited by examiner

MODULAR SELF-TRACKING MICRO-CONCENTRATOR FOR SPACE POWER

CROSS REFERENCE TO RELATED APPLICATIONS

This patent application is a continuation-in-part of prior U.S. patent application Ser. No. 14/186,703 entitled, "Micro-concentrator Solar Array Using Micro-Electromechanical Systems (MEMS) Based Reflectors," which was filed on Feb. 21, 2014, and which is expressly incorporated herein by this reference in its entirety.

BACKGROUND

Increasing the efficiency of electric power generation using solar or photovoltaic cells is an ongoing pursuit. Solar cells convert light energy, typically from the sun, into electrical energy. The light intensity on a solar cell may be referred to as the number of suns. On the surface of the Earth, a 1-sun concentration may correspond to a standard illumination at 1 kW/m2. In space, a 1-sun concentration may correspond to a standard illumination at 1.353 kW/m2.

Widespread adoption of solar cells for power generation may require further breakthrough in both the cost and efficiency. For example, many solar power generators currently available employ flat-plate technologies, where the solar cells operate under 1-sun concentration. These types of solar power generators have relatively low solar-to-power conversion efficiencies, are relatively large and cumbersome, and tend to transform a majority of light energy into heat. Moreover, these solar power generators may result in relatively long charge times in practice. Specifically, sometimes charging equipment using the solar power generator may take many hours, even over several days. In addition to the long charge times, the positions of the solar power generators need to be adjusted periodically during the day in order to accommodate the changing position of the sun in the sky.

Solar power generators may be used in a wide variety of applications. FIG. 1 illustrates the use of solar power generators in connection with a satellite. Illustrated in FIG. 1 is satellite 1. The satellite 1 may be used in various ways, including, but not limited to, communication, global positioning, and military-based applications. To provide power to the satellite 1, the satellite 1 may have installed a solar power generator 2. The solar power generator 2 may be a collection of solar cells, typically configured as large, foldable blankets or wings that may be deployed from a stowed configuration by unfolding the micro-concentrator solar module blanket for receiving light from the sun and converting that light to electrical power for use by the satellite. Because of its location in space and due to the size and configuration of the micro-concentrator solar module blankets, replacing, repairing, or upgrading the solar power generator 2 may be difficult and/or expensive.

It is with respect to these and other considerations that the disclosure herein is presented.

SUMMARY

It should be appreciated that this Summary is provided to introduce a selection of concepts in a simplified form that are further described below in the Detailed Description. This Summary is not intended to be used to limit the scope of the claimed subject matter.

According to embodiments disclosed herein, a micro-concentrator modular array is described. The micro-concentrator modular array may include a plurality of micro-concentrator solar modules and a connector. The plurality of micro-concentrator solar modules may include a plurality of solar cells. At least two of the plurality of micro-concentrator solar modules may include a connector pad configured to facilitate a connection with an adjacent micro-concentrator solar module. The connector may be configured to removably engage connector pads of two adjacent micro-concentrator solar modules to connect the two adjacent micro-concentrator solar modules.

According to additional embodiments disclosed herein, a method to change electrical capacity of a micro-concentrator modular array is described. The method may include determining if the electrical capacity of the micro-concentrator modular array is to be changed, and in response to determining that the capacity of the micro-concentrator modular array is to be changed, determining whether to replace one of the plurality of micro-concentrator solar modules, add an additional micro-concentrator solar module to the plurality of micro-concentrator solar modules, or remove a micro-concentrator solar module from the plurality of micro-concentrator solar modules.

The method may further include in response to a determination to replace one of the plurality of micro-concentrator solar modules, identifying the one of the plurality of micro-concentrator solar modules, replacing the identified one of the plurality of micro-concentrator solar modules with a new micro-concentrator solar module, and placing the new micro-concentrator solar module in service. The micro-concentrator modular array may include a plurality of micro-concentrator solar modules comprising a plurality of solar cells, a plurality of micro-electromechanical systems (MEMS) based reflectors, wherein the MEMS based reflectors are each selectively tiltable about at least one axis to reflect a beam of light, wherein at least two of the plurality of micro-concentrator solar modules comprise a connector pad configured to facilitate a connection with an adjacent micro-concentrator solar module.

According to further embodiments disclosed herein, a micro-concentrator solar module is disclosed. The micro-concentrator solar module may include a plurality of solar cells, and a connector pad configured to facilitate a connection with an adjacent micro-concentrator solar module.

According to still further embodiments disclosed herein, a satellite is described. The satellite may include a micro-concentrator modular array. The micro-concentrator modular array may include a plurality of solar cells, wherein at least two of the plurality of micro-concentrator solar modules comprise a connector pad configured to facilitate a connection between the at least two of the plurality of micro-concentrator solar modules. The micro-concentrator modular array may further include a plurality of micro-electromechanical systems (MEMS) based reflectors, wherein the MEMS based reflectors are each selectively tiltable about at least one axis to reflect a beam of light. The microconcentrator modular array may also include a connector configured to connect the at least two of the plurality of micro-concentrator solar modules.

The features, functions, and advantages that have been discussed can be achieved independently in various embodiments of the present disclosure or may be combined in yet other embodiments, further details of which can be seen with reference to the following description and drawings.

BRIEF DESCRIPTION OF THE DRAWINGS

The embodiments presented herein will become more fully understood from the detailed description and the accompanying drawings, wherein.

The plurality of figures presented in this application illustrates variations and different aspects of the embodiments of the present disclosure. Accordingly, the detailed description on each illustration will describe the differences identified in the corresponding illustration.

DETAILED DESCRIPTION

The following detailed description is directed to technologies for a solar cell array formed from modular self-tracking micro-concentrators. As discussed above, in some implementations, to achieve a desired voltage, one or more micro-concentrator solar modules may be electrically connected with one or more other micro-concentrator solar modules. It may be difficult or expensive, or both, to change the output of the one or more connected micro-concentrator solar modules. This may be especially true if the connected micro-concentrator solar modules are in a relatively inaccessible location like space. It may be desirable, in some implementations, to provide a system whereby one or more micro-concentrator solar modules may be replaced, added, or removed in a modular fashion to reduce the expense or difficulty in changing the voltage output of the connected micro-concentrator solar modules.

According to various embodiments, solar cell-mirror combinations (e.g. a solar module) may be combined to form a micro-concentrator modular (MCM) array. MCM arrays may be configured to be modular, e.g. one micro-concentrator solar module of a MCM array may have one or more connectors that may facilitate the disconnection, removal, and/or connection of a micro-concentrator solar module of a MCM array to another micro-concentrator solar module of a MCM array. The MCM array may be configured to have an application-specific voltage or power output. One or more of the micro-concentrator solar modules forming the MCM array may include reflective micro-electromechanical (MEM) mirrors that are used to focus light onto solar cells.

These and some other aspects of the presently disclosed subject matter are described in further detail, below. In the following description, references are made to the accompanying drawings that form a part hereof, and which are shown by way of illustration, specific embodiments, or examples.

Figure 2:
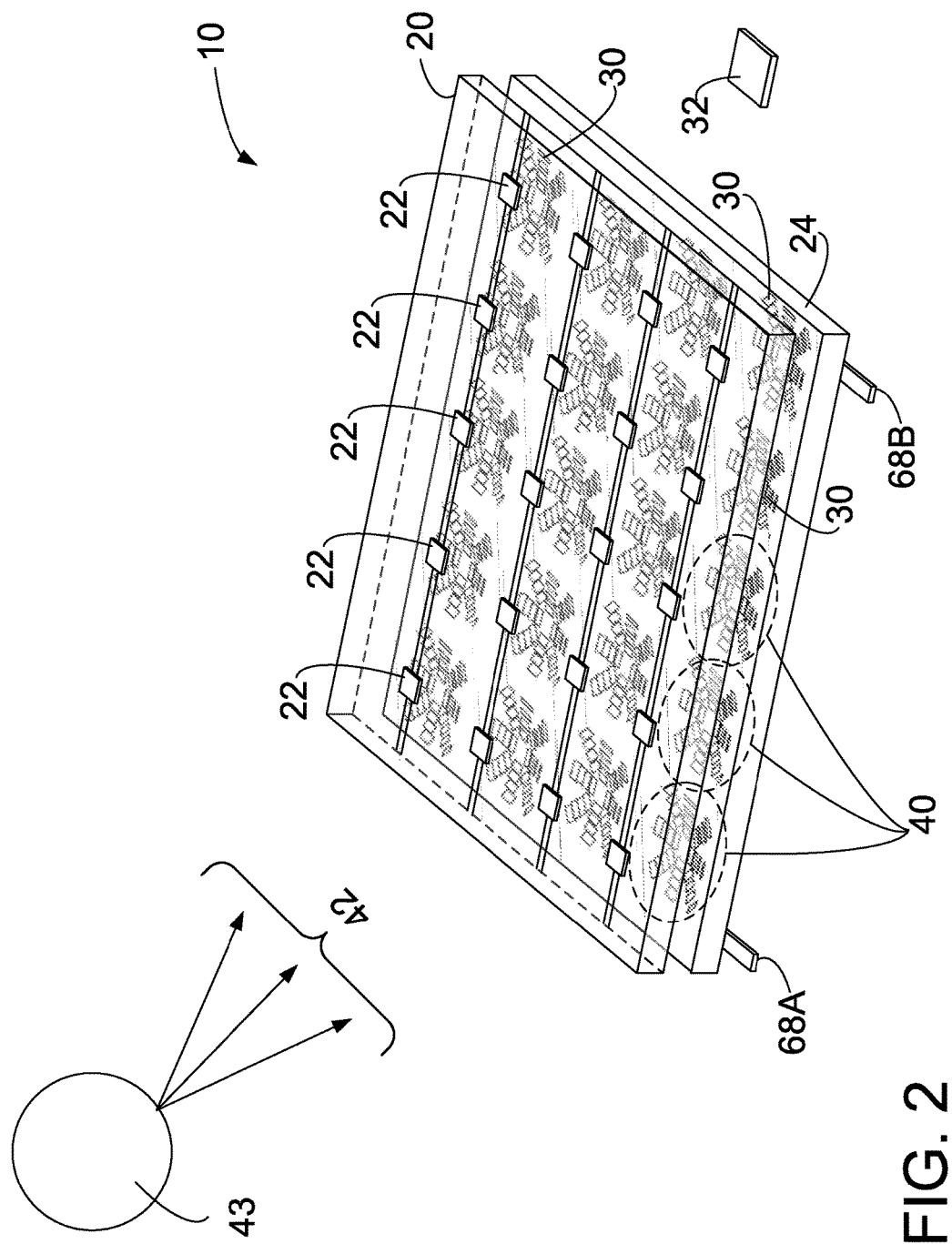
FIG. 2 is top perspective view of a micro-concentrator solar module including a plurality of solar cells arranged on a coverglass and a plurality of micro-electro-mechanical systems (MEMS) based reflectors (or mirrors) arranged on a substrate according to at least one embodiment disclosed herein.

FIG. 2 is an illustration of a micro-concentrator solar module 10 according to an aspect of the disclosure. In some implementations, the micro-concentrator solar module 10 may be used to provide electrical power for various applications including, but not limited to, satellite-based systems. The micro-concentrator solar module 10 may include a coverglass 20, a plurality of solar cells 22, a substrate 24, a plurality of micro-electromechanical systems (MEMS) based mirrors or reflectors 30, and a control module 32. In the exemplary aspect as shown, the solar cells 22 may be arranged in a 4×5 array upon the coverglass 20, which results in a total of twenty solar cells 22 included within the micro-concentrator solar module 10. However, those skilled in the art will appreciate that the micro-concentrator solar module 10 may include any number of solar cells 22. An array 40 of reflectors 30 may be associated with each solar cell 22. Each reflector 30 included within the array 40 may be positioned relative to the associated solar cell 22 in order to focus or reflect a plurality of light beams 42 generated by a light source 43 onto the solar cell 22.

The light source may be any type of radiating energy source such as, for example, man-made lighting in a building, or the sun. One or more of the reflectors 30 may be selectively tiltable such that if the position of the light source changes, the reflector 30 located within the associated array 40 may be tilted accordingly in order to track the changed position of the light source relative to the associated solar cell 22. For example, if the light source is the sun, then each reflector 30 located within an associated array 40 may be tilted accordingly in order to track the changing position of the sun throughout the day. The above aspects and additional aspects of the micro-concentrator solar module 10 may be found in U.S. patent application Ser. No. 14/186,703 entitled, "Micro-concentrator Solar Array Using Micro-electromechanical Systems (MEMS) Based Reflectors," the entire contents of which are incorporated herein by reference as is fully set forth herein.

The micro-concentrator solar module 10 may be used in any application where light energy, typically from the sun, may be converted into electrical energy. For example, FIG. 2 illustrates a single micro-concentrator solar module 10 for purposes of convenience and clarity. The single micro-concentrator solar module 10 in FIG. 2 may be used in relatively compact applications such as, for example, a slim-line pocket-sized portable power generator. However, the single micro-concentrator solar module 10 may be electrically connected or ganged with other micro-concentrator solar modules in order to create a two-dimensional or tiled array of multiple micro-concentrator solar modules, illustrated in more detail in the following figures.

The two-dimensional array of multiple micro-concentrator solar modules may be used in relatively large-scale applications such as, for example, a terrestrial portable power generator, an unmanned aerial vehicle (UAV), or a satellite. The coverglass 20 may be constructed of any transparent material that allows for the light beams 42 to pass through such as, for example, glass, plastic, or silicon dioxide. The substrate 24 may be used to support or mount the reflectors 30. In one non-limiting aspect, the substrate 24 may be constructed of fused silica. The micro-concentrator solar module 10 may include connectors 68A and 68B. The connectors 68A and 68B may provide for the ability to electrically and/or mechanically connect the micro-concentrator solar module 10 to another micro-concentrator solar module to form a micro-concentrator modular array, illustrated in more detail, below.

Figure 3:
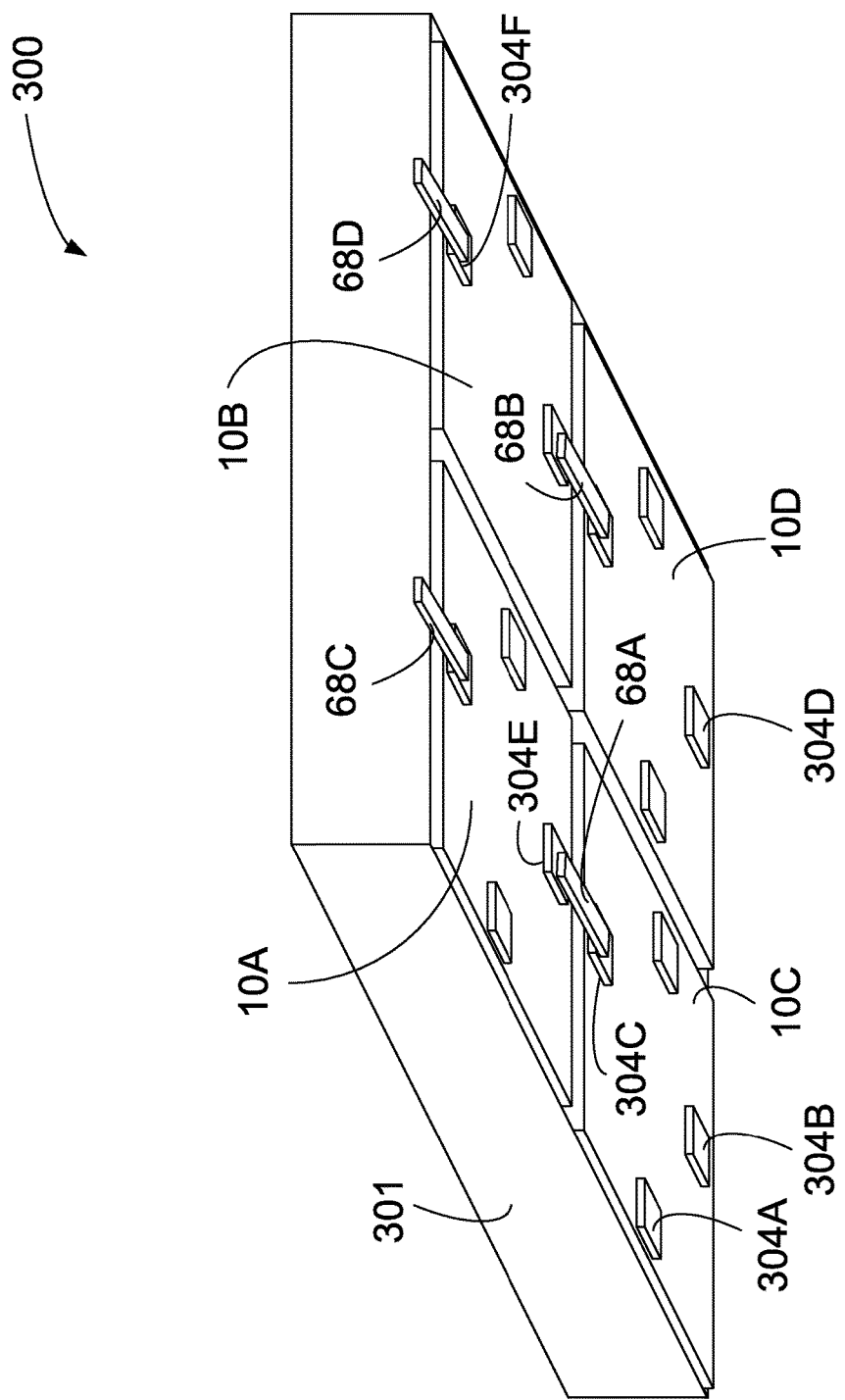
FIG. 3 is a bottom perspective view of a micro-concentrator modular array according to at least one embodiment disclosed herein.

FIG. 3 is a bottom perspective view of a micro-concentrator modular array 300. The micro-concentrator modular array 300 may be contained within a housing 301. In some implementations, the housing 301 may provide structural support and/or protection for the internal components of the micro-concentrator modular array 300. It should be noted, however, that the presently disclosed subject matter is not limited to the use of the housing 301 or any particular size, shape, or configuration of the housing 301.

Figure 1:
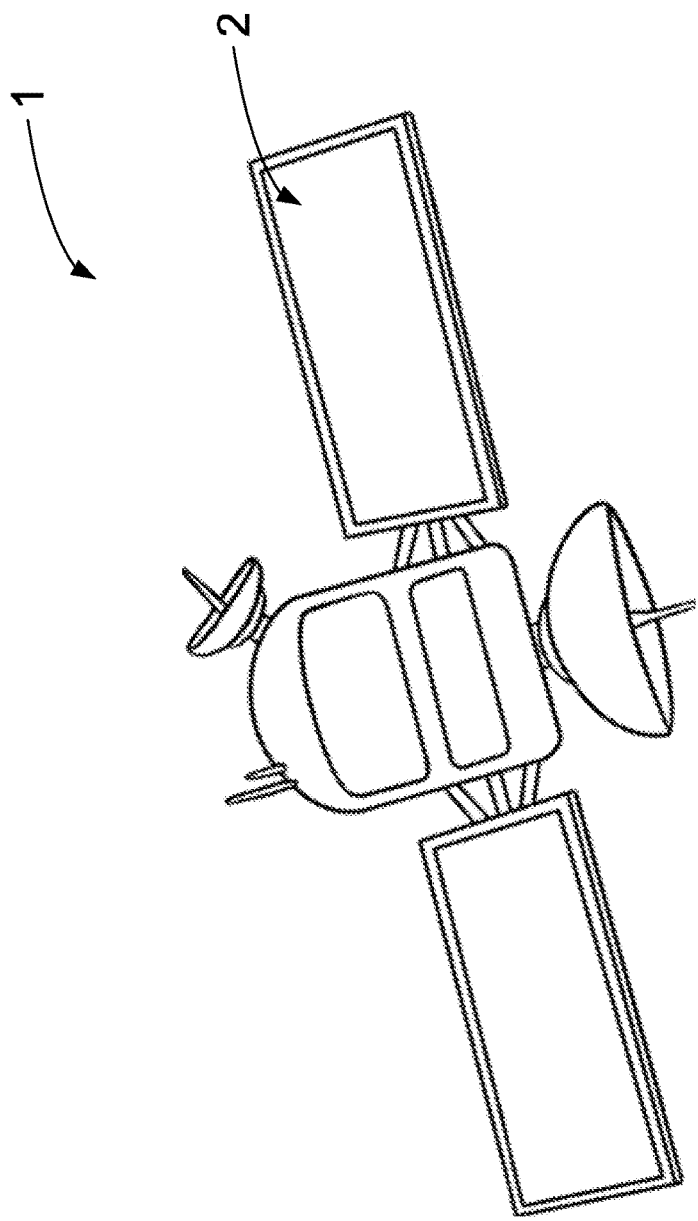
FIG. 1 is an illustration of a satellite comprising a solar power generator.

The micro-concentrator modular array 300 includes micro-concentrator solar modules 10A-10D (hereinafter referred to collectively as the "micro-concentrator solar modules 10," and individually as the "micro-concentrator solar module 10A," the "micro-concentrator solar module 10B," and the like). In some implementations, the micro-concentrator solar modules 10 may be constructed of a plurality of solar cells using MEMS-based mirrors or reflectors, described by way of example in FIG. 1, above. For example, one or more of the micro-concentrator solar modules 10 may take the form of the micro-concentrator solar module 10 of FIG. 2.

It may be desirable to electrically and/or mechanically connect one or more of the micro-concentrator solar modules 10 to other micro-concentrator solar modules 10 in a modular fashion. For example, in some implementations, a micro-concentrator solar module 10 may produce a certain voltage. If the voltage is insufficient or a higher voltage is desirable, two or more micro-concentrator solar modules 10 may be electrically connected in a series configuration to add the voltage of one of the micro-concentrator solar modules 10 to the voltage of another one of the micro-concentrator solar modules 10 to provide for a higher voltage.

In other configurations, if a current is insufficient or a higher current is desirable, two or more micro-concentrator solar modules 10 may be electrically connected in a parallel configuration to provide for a higher current. These and other configurations are considered to be within the scope of the present disclosure. For example, a combination parallel/series electrical connection may be used.

To electrically and/or mechanically connect one of the micro-concentrator solar modules 10 to another one of the micro-concentrator solar modules 10, the micro-concentrator solar modules 10 may include connector pads 304A-304F (hereinafter referred to collectively as the "connector pads 304," and individually as the "connector pad 304A," the "connector pad 304B," and the like) on a bottom surface of the micro-concentrator solar modules 10. The connector pads 304 may be comprised of electrically conductive material. The connector pads 304 may be in electrical communication with an output of one or more of the micro-concentrator solar modules 10, illustrated in more detail in FIG. 4, below.

The presently disclosed subject matter is not limited to any particular size, shape, or configuration of connector pads 304. For example, as illustrated, the micro-concentrator solar modules 10 have four (4) connector pads 304. This may provide some benefits in certain implementations. For example, having four connector pads 304 may allow the micro-concentrator solar modules 10 to be inserted and connected in more than one orientation with respect to other micro-concentrator solar modules 10. It should be understood, however, that the micro-concentrator solar modules 10 may include more than or fewer than four connector pads 304. Further, it should be understood that the presently disclosed subject matter is not limited to any particular location for the installation of the connector pads 304, as the connector pads 304 may be installed on various locations of the micro-concentrator solar modules 10 depending on the particular configuration or requirements of the micro-concentrator solar modules 10.

To electrically and/or mechanically connect one of the micro-concentrator solar modules 10 to another one of the micro-concentrator solar modules 10, connectors 68A-68D (hereinafter referred to collectively as the "connectors 68," and individually as the "connector 68A," the "connector 68B," and the like) may be used. The connectors 68 may be formed from electrically conductive material. In some configurations, the connectors 68 may be configured to provide an electrical connection between micro-concentrator solar modules 10 to electrically connect one micro-concentrator solar module 10 to an adjacent micro-concentrator solar module 10. In other configurations, the connectors 68 may be configured to provide a mechanical connection between micro-concentrator solar modules 10 to mechanically connect one of the micro-concentrator solar modules 10 to an adjacent micro-concentrator solar module 10.

In other configurations, the connectors 68 may be configured to provide both a mechanical and electrical connection. In some configurations, the connectors 68 may include one or more electrical features configured to control the flow of electrical power through the connectors 68. In one example, one or more of the connectors 68 may include a diode configured to prevent the flow of electrical power in a certain direction, while allowing the flow of electrical power in another direction.

In the example illustrated in FIG. 3, the connector 68A electrically and/or mechanically connects the micro-concentrator solar module 10C to the micro-concentrator solar module 10A through the connector pads 304C and 304E. In the implementations in which the connection is electrical, depending on the particular electrical configuration, electrical power generated by micro-concentrator solar module 10C may be communicated to micro-concentrator solar module 10A through the connector 68A. In another example, electrical power generated by micro-concentrator solar module 10D may be communicated to micro-concentrator solar module 10B through the connector 68B. The output of the micro-concentrator solar module 10A may be communicated to an external system through connector 68C, or another type of electrical connector. In a similar manner, the output of the micro-concentrator solar module 10B may be communicated to an external system through connector 68D. In one implementation, the electrical connector 68C may be an input or output and the electrical connector 68D may be a corresponding output or input to provide an electrical circuit for the micro-concentrator modular array 300.

Figure 4:
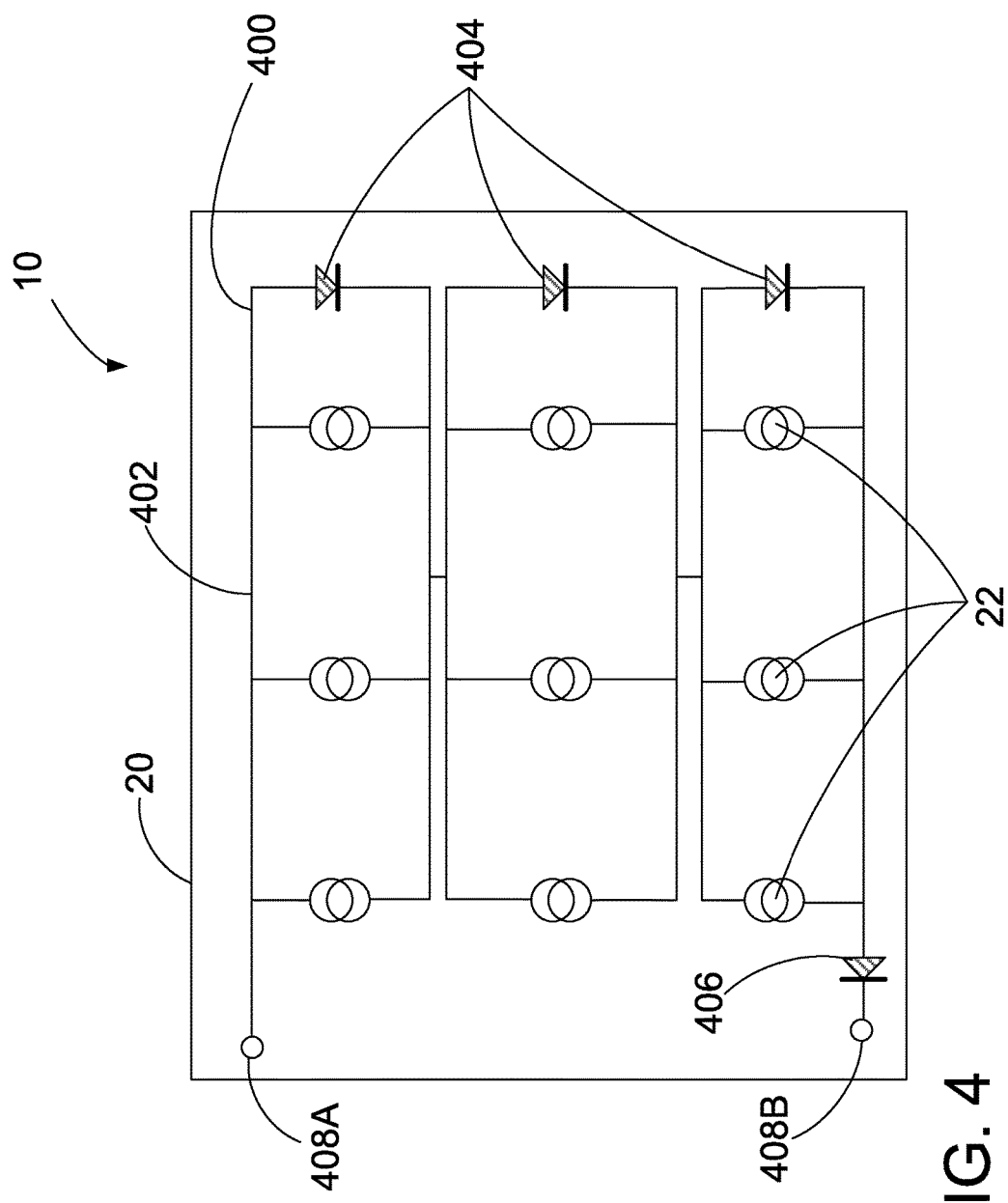
FIG. 4 is a diagram of a circuit that may be used for one or more micro-concentrator solar modules of a micro-concentrator modular array according to at least one embodiment disclosed herein.

FIG. 4 is a diagram of a circuit 400 that may be used for one or more of the micro-concentrator solar modules 10 of the micro-concentrator modular array 300 of FIG. 3. The circuit 400 includes solar cells 22. One or more of the solar cells 22 may generate electrical power from a light source, such as the sun. One or more of the solar cells 22 may be in electrical communication with other solar cells 22 via the circuit 400. The circuit 400 may be formed from an electrically conductive material (such as copper) and may be wired, printed, or in other forms suitable for a particular application. The circuit 400 may be protected by or printed on the coverglass 20. To direct the flow of current through the circuit 400, the circuit 400 may include one or more bypass diodes 404. The bypass diodes 404 may provide for the flow of electricity in one direction, while preventing or reducing the flow of electricity in another direction.

The circuit 400 may also include a protection diode 406. In some implementations, the protection diode 406 may reduce the probability of current flow in an undesirable direction due to the operational characteristics of an adjoining solar cell. For example, the circuit 400 may be connected to another circuit 400 of another micro-concentrator solar module 10. If the other micro-concentrator solar module 10 has a large electrical output (created possibly by a solar event or lightning strike, or other event), the protection diode 406 may prevent electrical flow from the other micro-concentrator solar module 10 in a manner that may damage the circuit 400 or the components of the micro-concentrator solar module 10. In some configurations, one or more of the bypass diodes 404 and/or the protection diode 406 may be included within one or more of the connectors 68 of FIG. 3.

The circuit 400 may include an input 408A and an output 408B for receiving electrical power and for outputting electrical power, respectively. In some implementations, the circuit 400 may not include only an input 408A or only an output 408B. The input 408A and/or the output 408B may be used as the connectors 68 of FIG. 3 or may be in electrical communication with the connectors 68 of FIG. 3 to facilitate the transfer of electrical power.

Figure 5A:
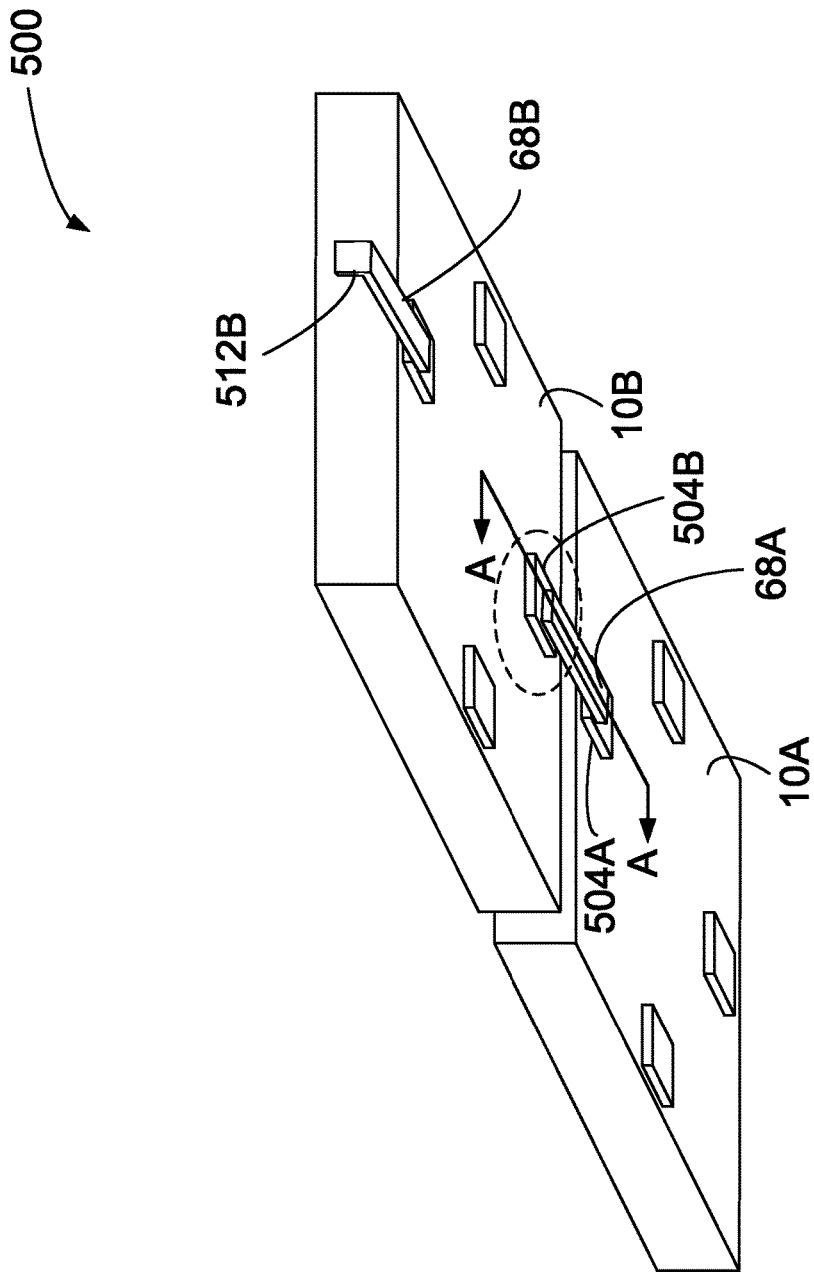
FIG. 5A is bottom perspective view of a micro-concentrator modular array using mechanical connectors according to at least one embodiment disclosed herein.

FIG. 5A is a bottom perspective view of a micro-concentrator modular array 500 using mechanical connectors. The micro-concentrator modular array 500 comprises micro-concentrator solar modules 10A and 10B. The micro-concentrator solar module 10A includes a connector pad 504A and the micro-concentrator solar module 10B includes a connector pad 504B. The micro-concentrator solar module 10A is in electrical communication with the micro-concentrator solar module 10B through a connector 68A that connects the connector pad 504A to the connector pad 504B. As mentioned above, in some implementations, the connector may be configured to provide a mechanical connection between micro-concentrator solar modules. In the example illustrated in FIG. 5, the connector pad 504A, the connector pad 504B, and the connector 68A include a mechanical feature that facilitates a mechanical securement of the micro-concentrator solar module 10A to the micro-concentrator solar module 10B, illustrated in further detail in FIG. 5B, below.

Figure 5B:
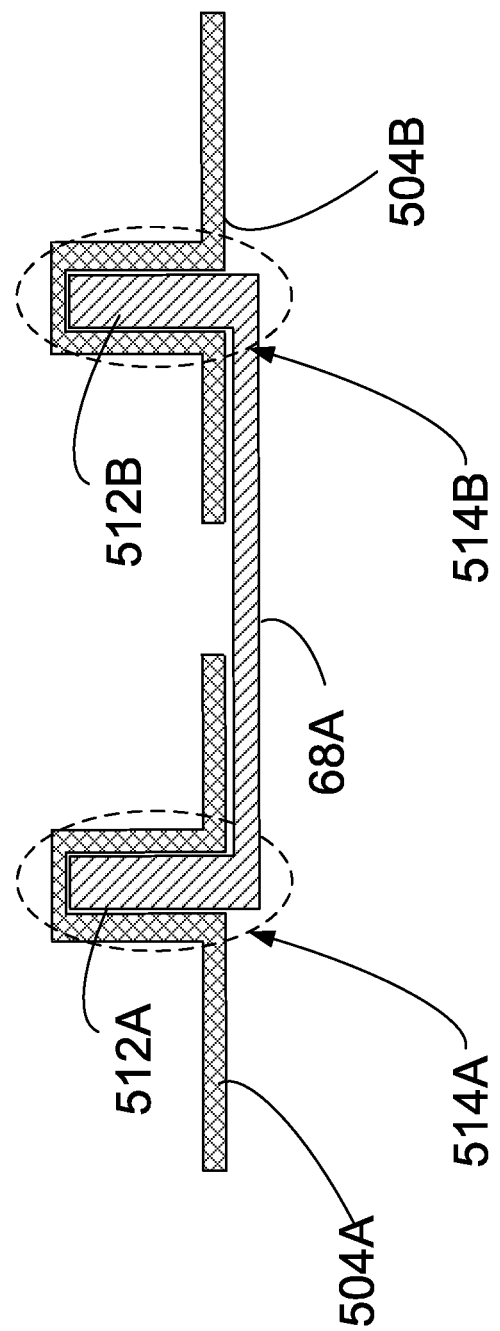
FIG. 5B is a cross-sectional view of a mechanical connector taken along line A-B of FIG. 5A according to at least one embodiment disclosure herein.

FIG. 5B is a cross-sectional view of the connector 68A, a connector pad 504A, and a connector pad 504B when taken along the line A-B of FIG. 5A. The connector pad 504A is affixed to the micro-concentrator solar module 10A (of FIG. 5A) and the connector pad 504B is affixed to the micro-concentrator solar module 10B (of FIG. 5A). The connector 68A is in mechanical communication with the connector pad 504A and the connector pad 504B. To provide mechanical securement of the connector 68A to the connector pad 504A and the connector pad 504B (and, therefore, the micro-concentrator solar module 10A to the micro-concentrator solar module 10B), the connector 68A may include tabs 512A and 512B. The tab 512A may be configured, sized, and shaped to interface with a void 514A of the connector pad 504A for insertion within the void 514A. The tab 512B may be configured, sized, and shaped to interface with a void 514B of the connector pad 504B for insertion within the void 514B.

When properly aligned and inserted, the tab 512A, in combination with the void 514A of the connector pad 504A, as well as the tab 512B in combination with the void 514B of the connector pad 504B, may provide a degree of mechanical securement. In some configurations, the connector 68A may only be configured for mechanical securement. In other configurations, the connector 68A may be configured for mechanical securement as well as provide an electrical pathway to facilitate the flow of electrical power from the micro-concentrator solar module 10A to the micro-concentrator solar module 10B, or vice versa.

Other micro-concentrator solar modules may be connected as well. In the example illustrated in FIG. 5A, the micro-concentrator solar module 10B includes a connector 68B with tab 512B. It should be noted that various combinations of connectors may be used. For example, a micro-concentrator solar module may use connectors that only provide for electrical power transfer, only connectors that provide for mechanical securement, or various combinations thereof. Mechanical connectors may take various forms.

In some implementations, the connectors 68 may include features that use friction, magnetism, or mechanical means (such as clasps) to achieve and maintain a mechanical connection. In other implementations, the connectors 68 may include features that allow for the flow of electrical power between the connectors 68. In further implementations, the connectors 68 may include more than one feature that provides both a mechanical and electrical connection between the micro-concentrator solar modules 10. The presently disclosed subject matter is not limited to any particular type of configuration.

In some instances, one or more of the micro-concentrator solar modules 10 may be replaced, taking advantage of the modular aspect of various implementations of the presently disclosed subject matter. In some examples, a micro-concentrator solar module may be removed and replaced in a micro-concentrator modular array, illustrated by way of example in FIGS. 6-8, below.

Figure 6:
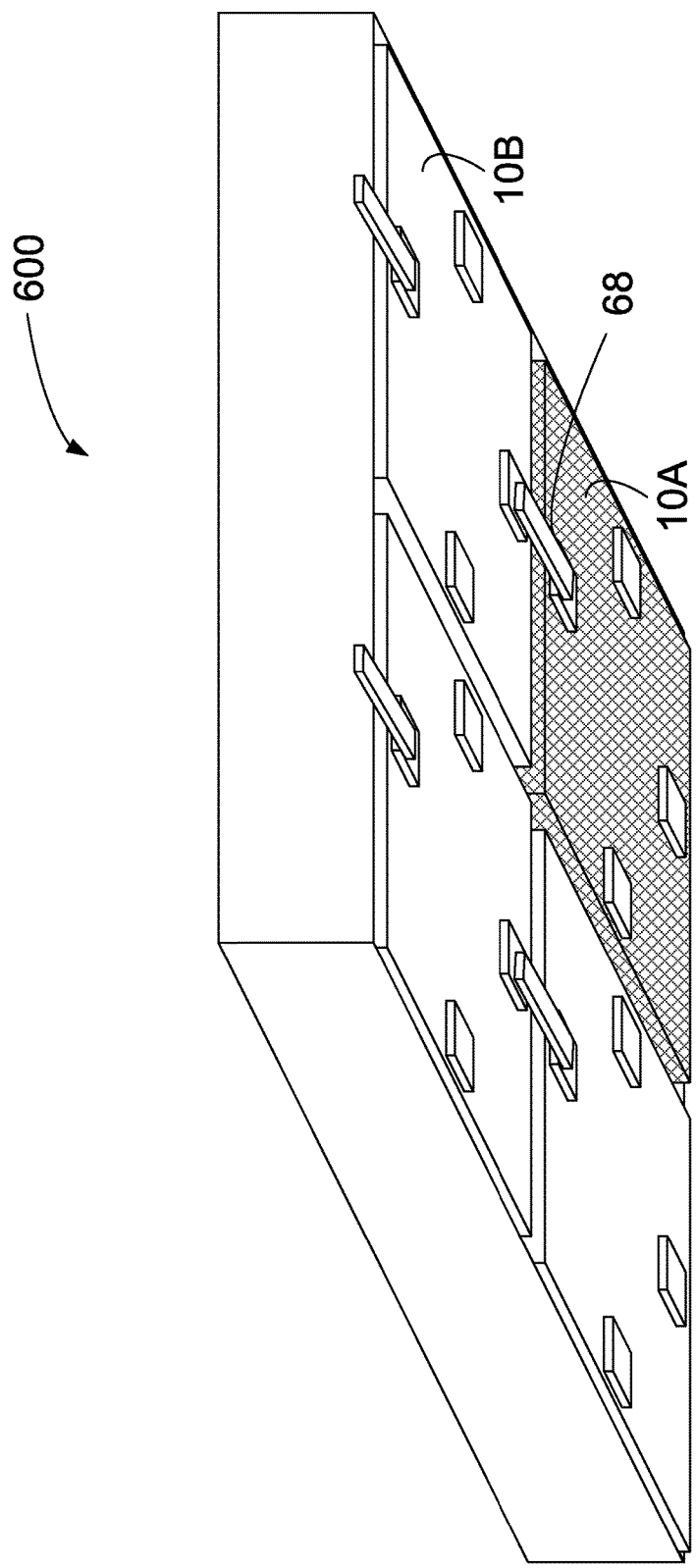
FIGS. 6-8 are bottom perspective views of a micro-concentrator modular array during the replacement of a micro-concentrator solar module according to at least one embodiment disclosed herein.

FIG. 6 is a bottom perspective view of a micro-concentrator modular array 600. The micro-concentrator modular array 600 includes a micro-concentrator solar module 10A. Due to various circumstances, the micro-concentrator solar module 10A may become unsuitable for use in the micro-concentrator modular array 600. The reasons for unsuitability of use may vary. For example, if the micro-concentrator modular array 600 is used in space, debris or other material striking the micro-concentrator solar module 10A may damage the micro-concentrator solar module 10A to the point that the micro-concentrator solar module 10A does not produce a suitable or acceptable amount of electrical power. In another example, the micro-concentrator solar module 10A may be an outdated or older module of the micro-concentrator modular array 600 that does not perform to the level of other micro-concentrator solar modules 10 in the micro-concentrator modular array 600.

If the micro-concentrator solar module 10A is to be replaced, the micro-concentrator solar module 10A may be identified (FIG. 6), removed (FIG. 7), and replaced (FIG. 8) by a new micro-concentrator solar module. In the illustration provided in FIG. 6, the micro-concentrator solar module 10A has been identified for replacement. The micro-concentrator solar module 10A is in electrical and/or mechanical communication with a micro-concentrator solar module 10B via a connector 68. The connector 68 may be removed or otherwise moved into a position that provides for the removal of the micro-concentrator solar module 10A. In some configurations, the connector 68 may be a fully detachable unit. In other configurations, the connector 68 may be configured to remain installed on one micro-concentrator solar module, while another micro-concentrator solar module is removed or added.

Figure 7:
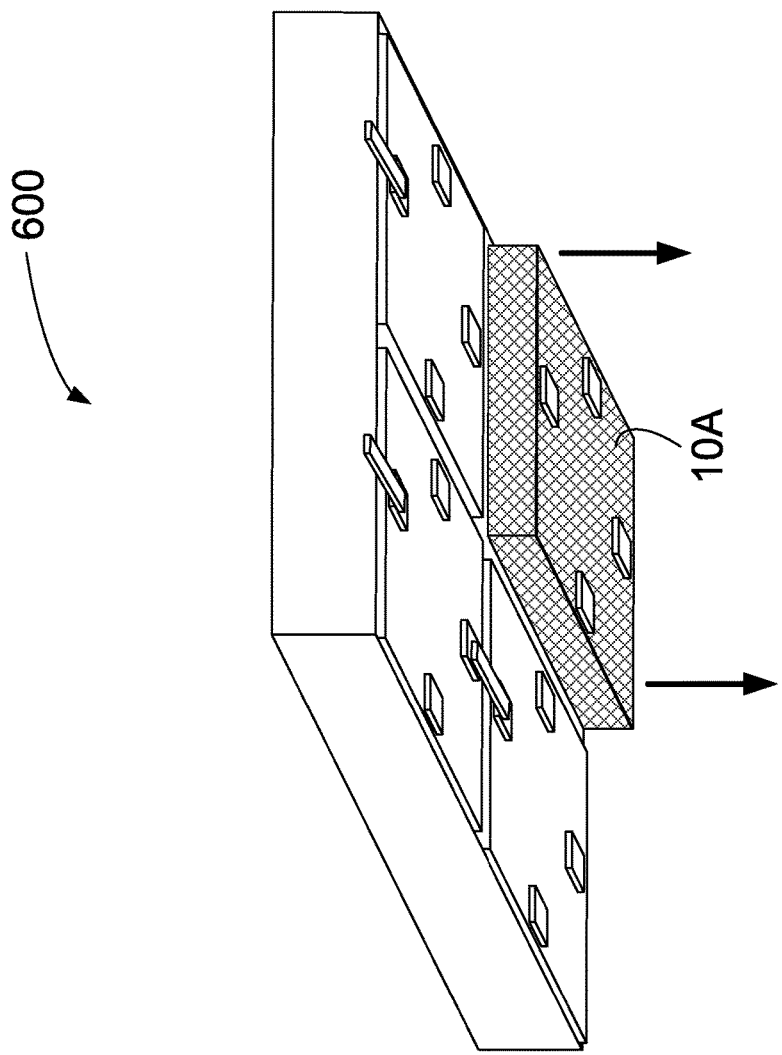
Figure 8:
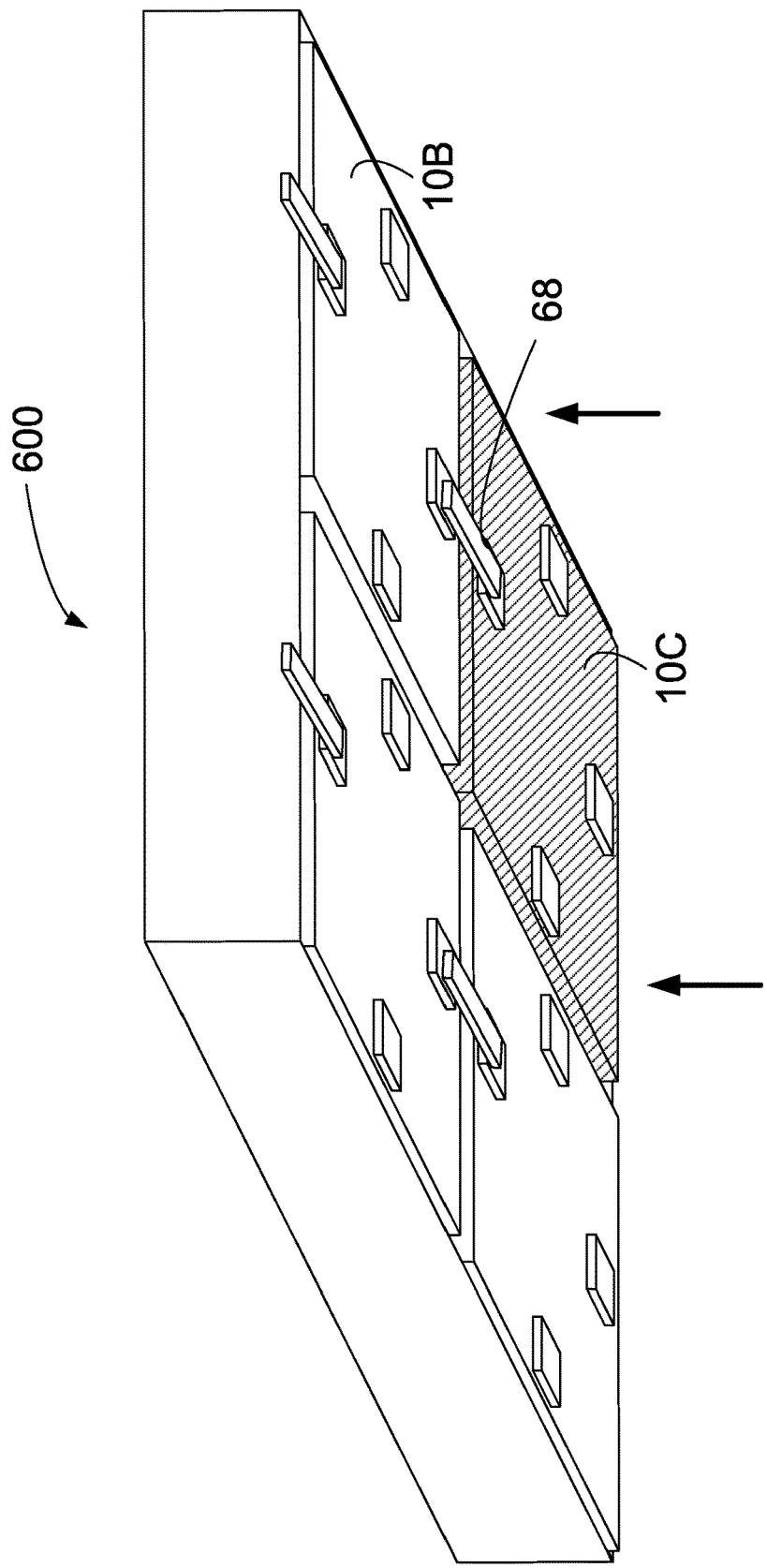

In FIG. 7, the micro-concentrator solar module 10A is illustrated as being partially removed from the micro-concentrator modular array 600. It should be noted that the direction of the movement of the micro-concentrator solar module 10A to remove the micro-concentrator solar module 10A is merely exemplary. For example, in some implementations, the micro-concentrator solar module 10A may be removed in a different direction than what is illustrated in FIG. 7. Once removed, the micro-concentrator solar module 10A may be replaced, illustrated in FIG. 8. In FIG. 8, the micro-concentrator solar module 10A has been replaced with a micro-concentrator solar module 10C. The micro-concentrator solar module 10C may be placed in electrical and/or mechanical communication with the micro-concentrator solar module 10B via the connector 68.

Figure 9:
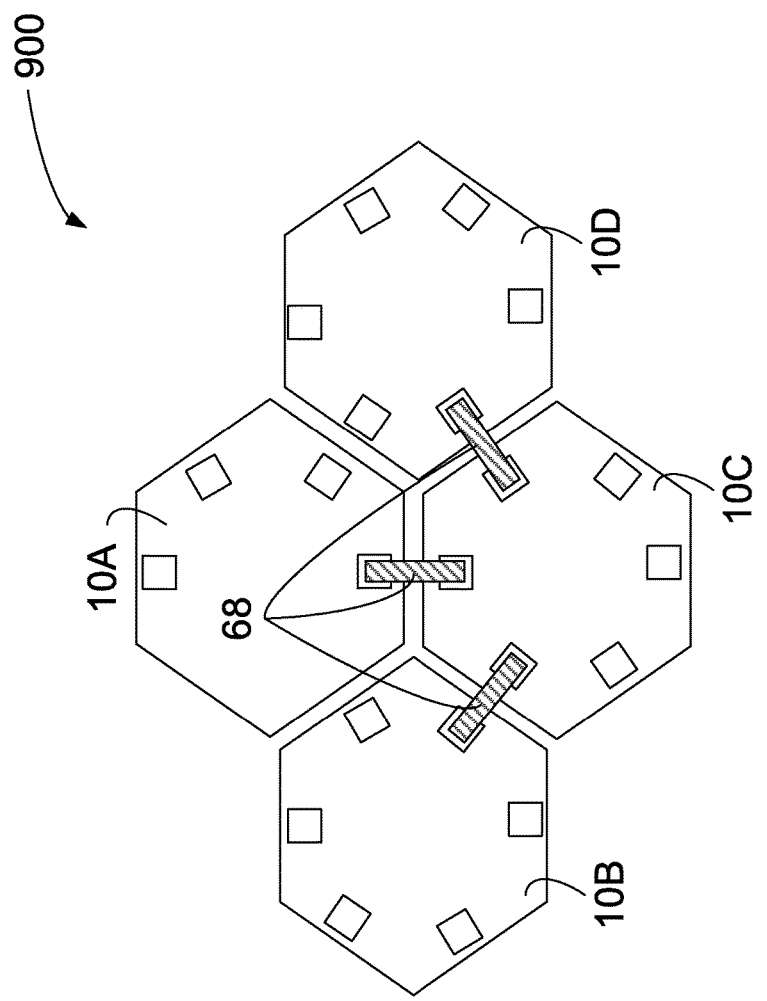
FIG. 9 is a bottom view of a micro-concentrator modular array in which an alternative shape of a micro-concentrator solar module is used according to at least one embodiment disclosed herein.

FIG. 9 is an illustration of a micro-concentrator modular array 900 in which an alternative shape of a micro-concentrator solar module is used. As mentioned above, the shape of a micro-concentrator solar module may take various forms depending on the particular configuration of the micro-concentrator modular array in which it is used. The micro-concentrator modular array 900 includes micro-concentrator solar modules 10A-10D. The micro-concentrator solar modules 10A-10D are placed in electrical communication via connectors 68.

The micro-concentrator solar modules 10A-10D are illustrated as having a hexagonal or honeycomb shape. The hexagonal or honeycomb shape of the micro-concentrator solar modules 10A-10D may provide various advantages over other shapes, such as circular, elliptical, or square. In some examples, a honeycomb shaped structure may provide for a structure having minimal density along with relative high out-of-plane compression properties and out-of-plane shear properties.

Figure 10:
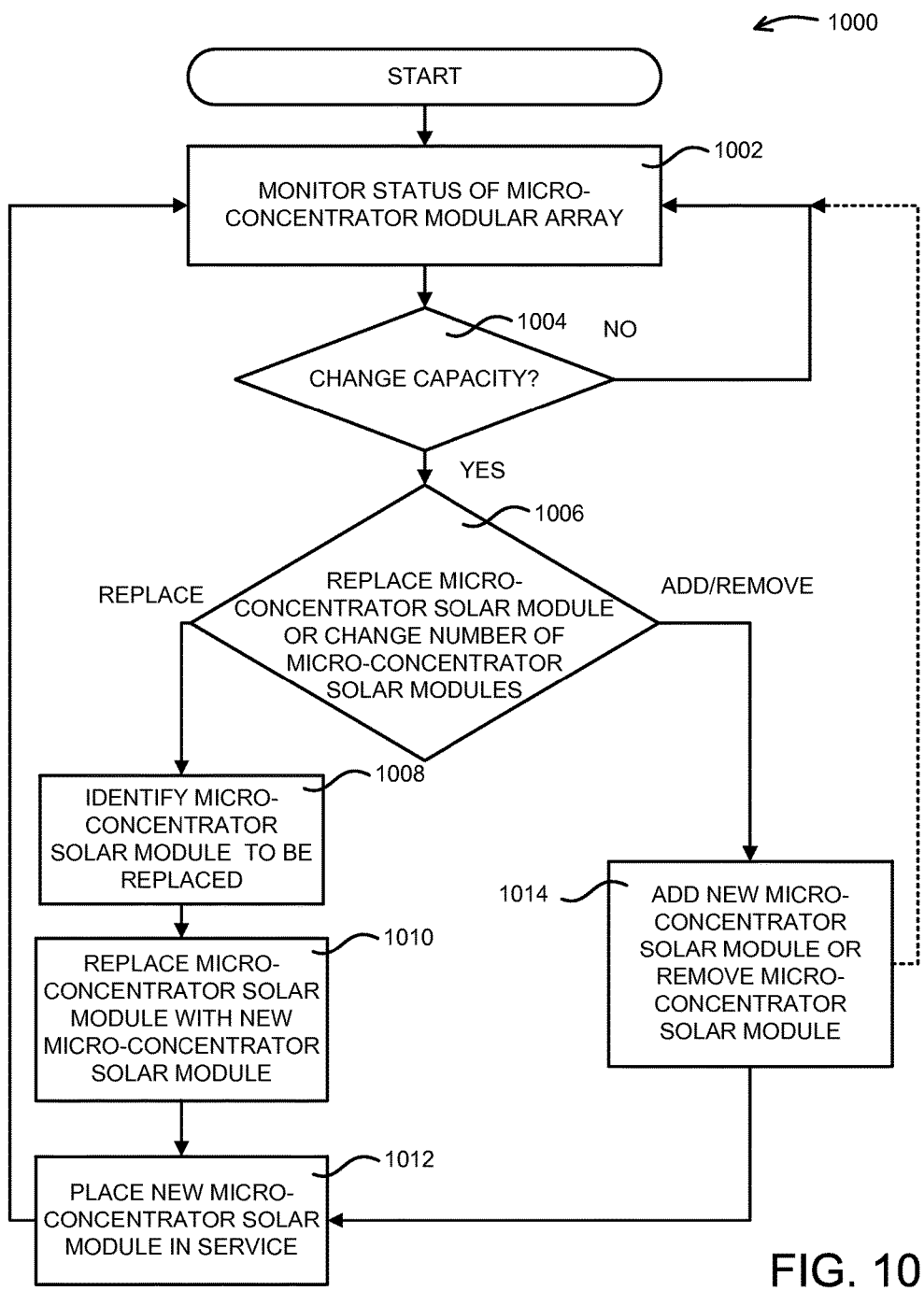
FIG. 10 illustrates one configuration of a routine to change electrical capacity according to at least one embodiment disclosed herein.

FIG. 10 illustrates one configuration of a routine 1000 to change electrical capacity of a micro-concentrator modular array according to at least one embodiment disclosed herein. Unless otherwise indicated, more or fewer operations may be performed than shown in the figures and described herein. Additionally, unless otherwise indicated, these operations may also be performed in a different order than those described herein.

The routine 1000 commences at operation 1002 ("monitor status of micro-concentrator modular array"), where the status of a micro-concentrator modular array is monitored. The status of the micro-concentrator modular array may involve the monitoring of several systems or outputs, among others. For example, the monitoring may include a measurement of the output of the micro-concentrator modular array for a particular amount of sunlight or ambient light. If the micro-concentrator modular array does not produce a desired or expected output, one or more micro-concentrator solar modules of the micro-concentrator modular array may be damaged.

The routine 1000 continues to operation 1004 ("change capacity"), where a determination is made as to whether or not a capacity of a micro-concentrator modular array is to be changed. The capacity may be related to the electrical power output of the micro-concentrator modular array. If the capacity does not need to be changed, the routine 1000 may continue to operation 1002, whereby the status of the micro-concentrator modular array is monitored.

If the capacity is to be changed as determined in operation 1004, the routine 1000 may continue to operation 1006 ("replace micro-concentrator solar module or change number of micro-concentrator solar modules"), where a determination is made as to replace a micro-concentrator solar module of the micro-concentrator modular array or to change the number of micro-concentrator solar modules in the micro-concentrator modular array. In some configurations, a micro-concentrator solar module may be a modularized micro-concentrator solar module capability of being removed, replaced, or added to other modularized or unmodularized micro-concentrator solar modules. In some examples, it may be desired to replace a micro-concentrator solar module due to degraded or unacceptable performance levels. In other examples, it may be desirable to add a micro-concentrator solar module to a micro-concentrator modular array to, among other possibilities, increase the performance of the micro-concentrator modular array.

If the determination at operation 1006 is to replace a micro-concentrator solar module, the routine 1000 may continue to operation 1008 ("identify micro-concentrator solar module to be replaced"), where the micro-concentrator solar module to be replaced is identified. In some examples, more than one micro-concentrator solar module may be replaced. The presently disclosed subject matter is not limited to any particular number of micro-concentrator solar modules to be replaced.

The routine 1000 may continue to operation 1010 ("replace micro-concentrator solar module with new micro-concentrator solar module"), where the micro-concentrator solar module identified in operation 1008 is replaced. FIGS. 6-8 illustrate an example operation for replacing a micro-concentrator solar module. The micro-concentrator solar module may be removed and a new micro-concentrator solar module may be inserted in its place. In conjunction with replacing the micro-concentrator solar module, one or more connectors that connect the to-be-replaced micro-concentrator solar module with another micro-concentrator solar module may be placed in a position to facilitate the movement of the to-be-replaced micro-concentrator solar module.

The routine 1000 may continue to operation 1012 ("place new micro-concentrator solar module in service"), where the new micro-concentrator solar module is placed into service. Placing into service may include electrically or mechanically connecting the new micro-concentrator solar module to one or more micro-concentrator solar modules of the micro-concentrator modular array. After replacement and placing into service, the routine 1000 may continue to operation 1002, whereby the status of the micro-concentrator modular array is monitored.

If at operation 1006 it is determined that the number of micro-concentrator solar modules is to be changed, the routine 1000 continues to operation 1014 ("add new micro-concentrator solar module or remove micro-concentrator solar module"), where a new micro-concentrator solar module is added to a micro-concentrator modular array or a micro-concentrator solar module in the micro-concentrator modular array is removed. Upon the addition of a micro-concentrator solar module, the routine 1000 may continue to operation 1012, where the new micro-concentrator solar module is placed in service. Upon the removal of a micro-concentrator solar module, the routine 1000 may continue to operation 1002, whereby the status of the micro-concentrator modular array is monitored. The routine 1000 may continue at operation 1002 or may end.

The subject matter described above is provided by way of illustration only and should not be construed as limiting. Various modifications and changes may be made to the subject matter described herein without following the example embodiments and applications illustrated and described, and without departing from the true spirit and scope of the present disclosure, which is set forth in the following claims.

What is claimed is:

1. A micro-concentrator modular array, comprising:
   a plurality of micro-concentrator solar modules, each of the plurality of micro-concentrator solar modules including:
   a plurality of solar cells,
   a substrate having a first surface and a second surface opposite of the first surface, the plurality of solar cells adjacently positioned over the first surface of the substrate,
   a connector pad coupled to the second surface of the substrate, the connector pad configured to facilitate a direct physical connection between adjacent micro-concentrator solar modules of the plurality of micro-concentrator solar modules,
   at least one void defined in the connector pad to extend from the second surface through at least a portion of the substrate towards the first surface of the substrate, and
   a connector having a first tab and a second tab separated by a connector body disposed therebetween defining a u-shape of the connector, wherein the first tab and the second tab extend into the at least one void of the connector pad of the adjacent micro-concentrator solar modules to connect the adjacent micro-concentrator solar modules.

2. The micro-concentrator modular array of claim 1, further comprising a plurality of micro-electromechanical systems (MEMS) based reflectors, wherein the MEMS based reflectors are each selectively tiltable about at least one axis to reflect a beam of light.

3. The micro-concentrator modular array of claim 1, wherein at least one of the plurality of micro-concentrator solar modules is selectively removable from the micro-concentrator modular array.

4. The micro-concentrator modular array of claim 1, wherein the plurality of solar cells are generally square or hexagonal.

5. The micro-concentrator modular array of claim 1, wherein the connection is a mechanical connection.

6. The micro-concentrator modular array of claim 5, wherein the removal of the first tab and the second tab of the connector from the at least one void of the connector pad interrupts the mechanical connection and the reinsertion of the first tab and the second tab of the connector into the at least one void of the connector pad reestablishes the mechanical connection.

7. The micro-concentrator modular array of claim 1, wherein the connection is an electrical connection.

8. The micro-concentrator modular array of claim 7, wherein at least one connector pad and the connector includes an electrically conductive material to conduct an electrical power output of a first solar cell of the plurality of solar cells to a second solar cell of the plurality of solar cells.

9. The micro-concentrator modular array of claim 1, further comprising a housing to contain at least a portion of the plurality of micro-concentrator solar modules and configured to provide structural support or protection for the plurality of micro-concentrator solar modules.

10. The micro-concentrator modular array of claim 1, wherein two or more of the plurality of solar cells are connected in a series configuration, two or more of the plurality of solar cells are connected in a parallel configuration, or two or more of the plurality of solar cells are connected in a series/parallel configuration.

11. The micro-concentrator modular array of claim 1, wherein at least one of the plurality of micro-concentrator solar modules includes a circuit including a protection diode configured to reduce a probability of current flow in an undesirable direction due to an operational characteristic of an adjoining solar cell.

12. The micro-concentrator modular array of claim 1, wherein at least one of the plurality of micro-concentrator solar modules includes a circuit including at least one bypass diode configured to direct the flow of electricity in the circuit.

13. A method to change electrical capacity of a micro-concentrator modular array, comprising:
    determining if the electrical capacity of the micro-concentrator modular array is to be changed, the micro-concentrator modular array including a plurality of micro-concentrator solar modules further including a plurality of solar cells, a plurality of micro-electromechanical systems (MEMS) based reflectors, wherein the MEMS based reflectors are each selectively tiltable about at least one axis to reflect a beam of light, wherein each of the plurality of micro-concentrator solar modules include a substrate having a first surface and a second surface opposite of the first surface, the plurality of solar cells adjacently positioned over the first surface of the substrate, a connector pad coupled to the second surface of the substrate and at least one void defined in the connector pad to extend from the second surface through at least a portion of the substrate towards the first surface of the substrate such that the connector pad is configured to facilitate a direct physical connection between adjacent micro-concentrator solar modules of the plurality of micro-concentrator solar modules, and wherein a connector having a first tab and a second tab separated by a connector body disposed therebetween defining a u-shape of the connector, wherein the first tab and the second tab extend into the at least one void of the connector pad of the adjacent micro-concentrator solar modules to form the connection between the adjacent micro-concentrator solar modules;
    in response to determining that the capacity of the micro-concentrator modular array is to be changed, determining whether to replace one of the plurality of micro-concentrator solar modules, add an additional micro-concentrator solar module to the plurality of micro-concentrator solar modules, or remove a micro-concentrator solar module from the plurality of micro-concentrator solar modules; and
    in response to a determination to replace one of the plurality of micro-concentrator solar modules, identifying the one of the plurality of micro-concentrator solar modules, replacing the identified one of the plurality of micro-concentrator solar modules with a new micro-concentrator solar module, and placing the new micro-concentrator solar module in service.

14. The method of claim 13, wherein in response to a determination to add an additional micro-concentrator solar module to the plurality of micro-concentrator solar modules, adding a new micro-concentrator solar module to the plurality of micro-concentrator solar modules, and placing the new micro-concentrator solar module in service.

15. The method of claim 13, wherein in response to a determination to remove a micro-concentrator solar module to the plurality of micro-concentrator solar modules, removing the micro-concentrator solar module.

16. The method of claim 13, wherein replacing the identified one of the plurality of micro-concentrator solar modules with a new micro-concentrator solar module includes moving the connector associated with the identified one of the plurality of micro-concentrator solar modules to a position to facilitate the movement of the identified one of the plurality of micro-concentrator solar modules, wherein the connector is configured to connect the identified one of the plurality of micro-concentrator solar modules to a second array of the plurality of micro-concentrator solar modules.

17. The method of claim 13, further comprising monitoring a status of the micro-concentrator modular array.

18. A micro-concentrator solar module, comprising:
a plurality of solar cells;
a substrate having a first surface and a second surface opposite of the first surface, the plurality of solar cells adjacently positioned over the first surface of the substrate;
a connector pad coupled to the second surface of the substrate, the connector pad configured to facilitate a direct physical connection between an adjacent micro-concentrator solar module;
at least one void defined in the connector pad to extend from the second surface through at least a portion of the substrate towards the first surface of the substrate; and
a connector having a first tab and a second tab separated by a connector body disposed therebetween defining a u-shape of the connector, wherein the first tab and the second tab extend into the at least one void of the connector pad to facilitate a removable connection with the adjacent micro-concentrator solar module.

19. The micro-concentrator solar module of claim 18, wherein the connector includes a protection diode configured to reduce a probability of current flow in an undesirable direction due to an operational characteristic of an adjoining solar cell.

20. The micro-concentrator solar module of claim 18, further comprising a plurality of micro-electromechanical systems (MEMS) based reflectors, wherein the MEMS based reflectors are each selectively tiltable about at least one axis to reflect a beam of light.

21. The micro-concentrator solar module of claim 18, wherein the micro-concentrator solar module is generally square or hexagonal.

22. The micro-concentrator solar module of claim 18, wherein the connection is a mechanical connection.

23. The micro-concentrator solar module of claim 22, further comprising a connector having a tab sized and shaped for insertion within the void.

24. The micro-concentrator solar module of claim 18, wherein the connection is an electrical connection.

25. The micro-concentrator solar module of claim 24, wherein at least one connector pad and the connector includes an electrically conductive material to conduct an electrical power output of the micro-concentrator solar module to an adjacent micro-concentrator solar module.

26. The micro-concentrator solar module of claim 18, further comprising a circuit including a protection diode configured to reduce a probability of current flow in an undesirable direction due to an operational characteristic of an adjoining solar cell.

27. The micro-concentrator solar module of claim 18, further comprising a circuit including at least one bypass diode configured to direct the flow of electricity in the circuit.

28. A satellite, comprising:
a micro-concentrator modular array including a plurality of micro-concentrator solar modules, wherein the plurality of micro-concentrator solar modules includes:
a plurality of solar cells,
a substrate having a first surface and a second surface opposite of the first surface, the plurality of solar cells adjacently positioned over the first surface of the substrate,
a connector pad coupled to the second surface of the substrate and configured to facilitate a direct physical connection between adjacent micro-concentrator solar modules,
at least one void defined in the connector pad to extend from the second surface through at least a portion of the substrate towards the first surface of the substrate,
a plurality of micro-electromechanical systems (MEMS) based reflectors, wherein the MEMS based reflectors are each selectively tiltable about at least one axis to reflect a beam of light, and
a connector including a first tab and a second tab separated by a connector body disposed therebetween defining a u-shape of the connector, wherein the first tab and the second tab extend into the at least one void of the connector pad to connect the adjacent micro-concentrator solar modules.

29. The satellite of claim 28, wherein the connection is a mechanical connection.

30. The satellite of claim 28, wherein the connection is an electrical connection, wherein at least one connector pad and the connector includes an electrically conductive material to conduct an electrical power output of a first solar cell of the plurality of solar cells to a second solar cell of the plurality of solar cells.

31. The satellite of claim 28, wherein two or more of the plurality of solar cells are connected in a series configuration, two or more of the plurality of solar cells are connected in a parallel configuration, or two or more of the plurality of solar cells are connected in a series/parallel configuration.

* * * * *